April 9, 1968 F. W. KRUSE, JR., ET AL 3,377,568

VOLTAGE TUNED OSCILLATOR

Filed March 25, 1966 2 Sheets-Sheet 1

INVENTOR.
FREDERICK W. KRUSE JR.
FREDERIC P. STORKE JR.
DOUGLAS L. BASKINS

Jack M. Wiseman
ATTORNEY

INVENTORS
FREDERICK W. KRUSE JR.
FREDERIC P. STORKE JR.
DOUGLAS L. BASKINS

Jack M. Wiseman
ATTORNEY

United States Patent Office 3,377,568

Patented Apr. 9, 1968

3,377,568

VOLTAGE TUNED OSCILLATOR

Frederick W. Kruse, Jr., and Frederic P. Storke, Jr., Palo Alto, and Douglas L. Baskins, Cupertino, Calif., assignors to Kruse Storke Electronics, Mountain View, Calif., a corporation of California Filed Mar. 25, 1966, Ser. No. 537,427
12 Claims. (Cl. 331—117)

ABSTRACT OF THE DISCLOSURE

The voltage tuned oscillator of the present invention comprises a hollow rectangular transmission line structure. Mounted within the structure is a tuning line which is disposed within the structure end-to-end midway between the sides thereof to form a symmetrical transmission line structure. Back-to-back variable-capacitance diodes are connected in the tuning line midway between the ends thereof. A variable voltage supply is connected to the variable-capacitance diodes for regulating the capacitance thereof to select the frequency generated by the oscillator. A transistor circuit is coupled to the tuning line and the variable-capacitance diodes for employing the same as a resonant load circuit for generating a signal.

*Specification*

The present invention relates in general to oscillators, and more particularly to a voltage tuned oscillator.

An object of the present invention is to provide a wide band oscillator with a stable frequency output.

Another object of the present invention is to provide a wide band oscillator with an improved power output.

Another object of the present invention is to provide a voltage tuned oscillator with a greater than octave tuning range.

Another object of the present invention is to provide an oscillator with a rapid tuning response for a fast sweep, a phase locked or an automatic frequency control operation.

Another object of the present invention is to provide an oscillator for high frequencies that is economical to manufacture without sacrificing reliability or durability.

Another object of the present invention is to provide an oscillator that is compact, lightweight and rugged.

Another object of the present invention is to provide an oscillator without moving parts.

Another object of the present invention is to provide a voltage tuned oscillator having an extremely long life with a negligible change in performance characteristics.

Another object of the present invention is to provide a high frequency oscillator with greater efficiency and with low harmonic output.

Another object of the present invention is to provide a high frequency oscillator with reduced spurious responses.

Other and further objects and advantages of the present invention will be apparent to one skilled in the art from the following description taken in conjunction with the accompanying drawings, in which.

Figure 1:
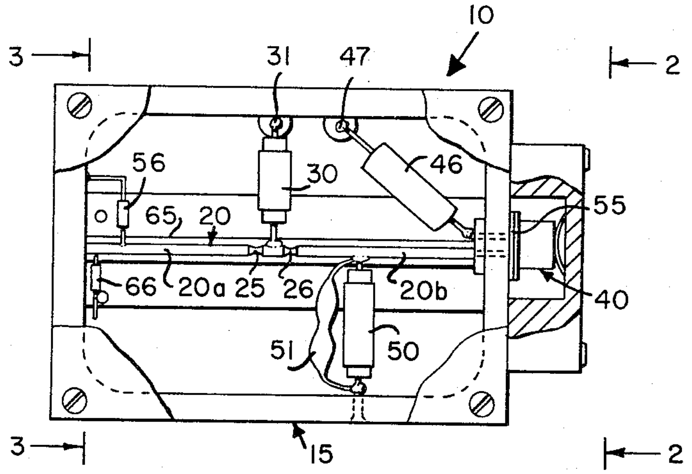
FIG. 1 is a fragmentary plan view of voltage tuned oscillator embodying the present invention with the cover thereof broken away.
Figure 2:
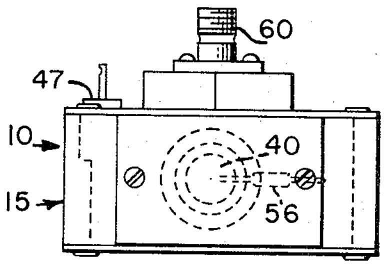
FIG. 2 is an end elevation of the oscillator shown in FIG. 1 taken along line 2—2 of FIG. 1.
Figure 3:
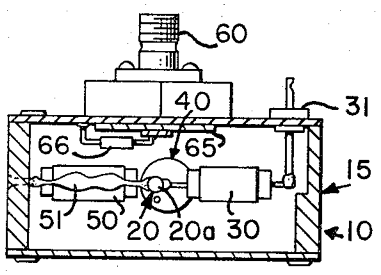
FIG. 3 is a vertical sectional view taken along line 3—3 of FIG. 1.

Illustrated in FIGS. 1–3 is the voltage tuned, transmission line oscillator 10 of the present invention which comprises a hollow rectangular transmission line or a rectangular cavity structure 15. The rectangular cavity structure or case 15 may be fully enclosed and is made of suitable conducting material, such as brass. The sides of the cavity structure 15 can be omitted, but the base and cover thereof must be maintained.

Mounted within the rectangular cavity structure 15 is a tuning line or probe 20 that is disposed lengthwise of the cavity structure 15 and extends from end-to-end midway between the sides of the rectangular cavity structure 15. The tuning line 20, which is divided into two equal parts **20*a* and 20*b*, is also located intermediate the base and cover of the cavity structure 15. Thus, the tuning line 20 is mounted relative to the rectangular cavity structure 15** to form a symmetrical transmission line structure.

Back-to-back variable-capacitance diodes 25 and 26 are connected to the tuning line 20 midway between the ends thereof. The diode 26 is connected to the portion of the tuning line segment **20*b* and the diode 25 is connected to the portion of the tuning line segment 20*a*. By connecting the variable-capacitance diodes 25 and 26 back-to-back, the transmission line structure is maintained approximately symmetrical so that substantially only odd harmonics are generated. In this manner, the cavity structure 15** has approximately one-half wavelength characteristics. Consequently, even harmonics are substantially cancelled out and the second harmonic is minimized. Therefore, substantially only the odd harmonics are generated.

Connected to the junction between the diodes 25 and 26 is a choke coil 30. One end of the choke coil 30 is connected to the junction between the diodes 25 and 26. The other end of the choke coil 30 is connected to an input terminal 31. Applied to the input terminal 31 is the source of the input tuning voltage that selects the frequency generated by the oscillator 10 by regulating the capacitance of the diodes 25 and 26.

Figure 4:
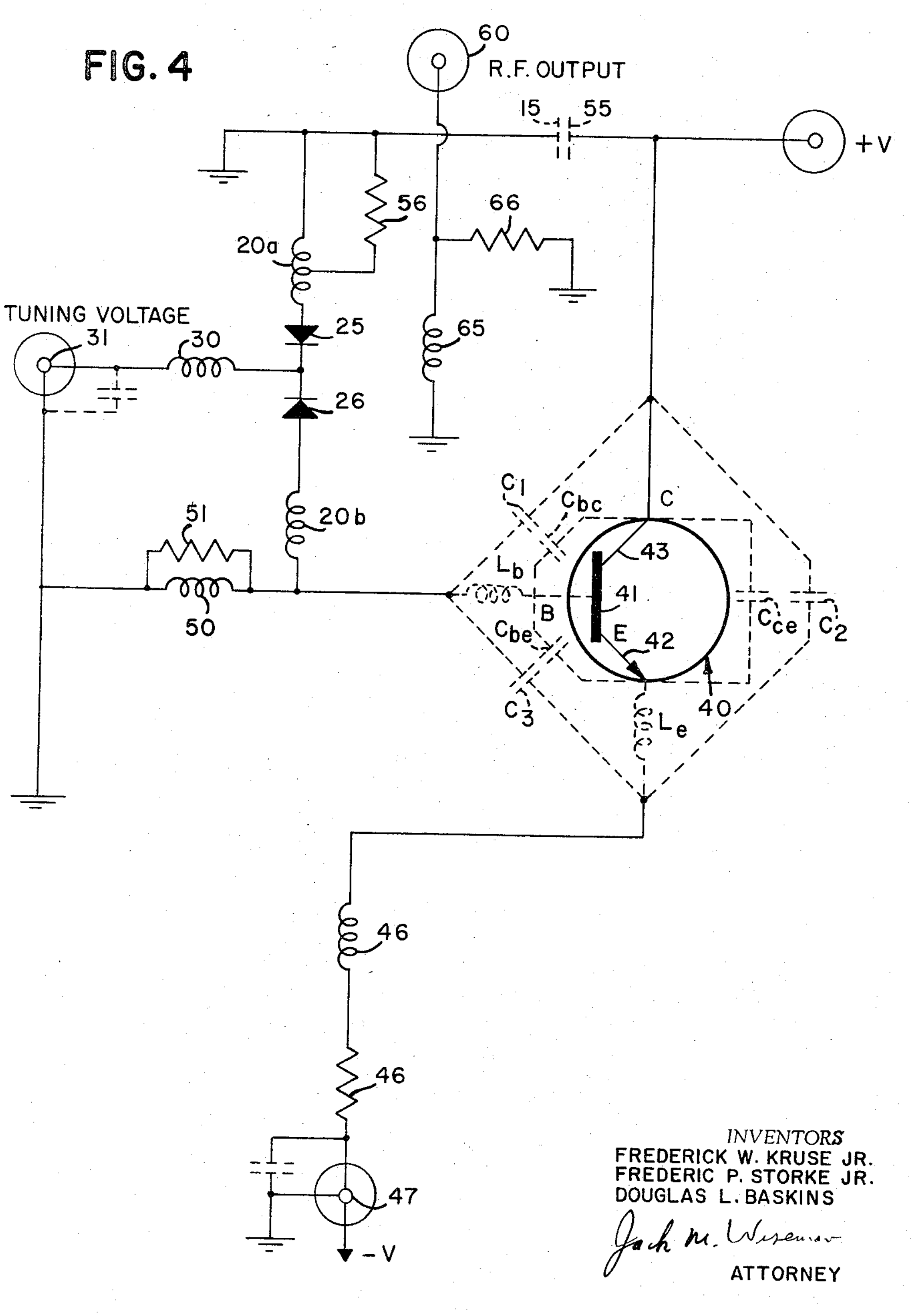
FIG. 4 is an equivalent circuit of the oscillator shown in FIG. 1.

A transistor 40, which in the preferred embodiment is a bipolar transistor, is mounted on the cavity structure 15 at one end thereof. The transistor 40 includes a base electrode 41, an emitter electrode 42 and a collector electrode 43. Coupled to the emitter electrode 42 through the emitter lead inductance $L_e$ (FIG. 4) is an emitter R.F. choke coil and resistor 46. One end of the emitter choke coil and resistor 46 is connected to a terminal adjacent said one end of the tuning line 20, at which end is located the transistor 40, and the other end of the choke coil and resistor 46 is connected to a terminal 47. Applied to the terminal 47 is a suitable source of emitter voltage, which is generally a negative biasing potential. By mounting the resistive component of the R.F. choke coil and resistor 46 within the cavity structure 15, relaxation or "squedging" oscillations are minimized. The resistive component of the R.F. choke coil and resistor 46 regulates the transistor current.

A base R.F. choke coil 50 has one end thereof connected to the tuning line 20 and the other end thereof connected to a ground connection on the side wall of the cavity structure 15. A damping resistor 51 is connected in parallel with the R.F. choke coil 50. The damping resistor 51 serves to reduce oscillations at spurious modes. Without a damping resistor there is a tendency for spurious mode oscillations to occur at frequencies below the transistor gain bandwidth product. The damping resistor 51 adjusts circuit losses to offset excess transistor gain to achieve best waveform and to eliminate the multi-moding. The base R.F. choke coil 50 is coupled in series with the base electrode 41 through the base lead inductance $L_b$ (FIG. 4) of the transistor 40. The collector 43 is connected to a suitable source of voltage, such as a positive collector potential. Suitable insulation 55, such as Mylar, is disposed around the case of the transistor 40 to form a collector by-pass capacitance between the cavity structure 15 and the insulation 55 for coupling the collector 43 to ground through the grounded portion of the cavity structure 15. Coupling the base electrode 41 of the transistor 40 in series with the tuning line 20 and grounding the collector electrode 43 to the cavity structure 15 through the capacitance of the cavity structure 15 and insulation 55 increases the frequency range of the oscillator 10, because the base lead inductance $L_b$ is made a part of the tuned load circuit.

Mounted on the cavity structure 15 at the end thereof opposite from which the transistor 40 is mounted is an R.F. output coupler 60 from which are transmitted the oscillating signals generated by the oscillator 10. A shorted stripline directional coupler 65 is disposed adjacent to the tuning line 20 for power transfer to the R.F. output coupler 60. A load impedance and level set resistor 66 is connected in parallel with the R.F. output coupler 60. The shorted stripline directional coupler 65 serves to reduce harmonic power in the output of the cavity structure 15, permits simple adjustment of the R.F. output coupler 60, and affords good load isolation. A resistor 56 connected to the cavity structure 15 is employed to reduce second harmonics.

By the employment of the rectangular cavity transmission line structure 15, the R.F. choke coils 30, 46 and 50 are located in the low R.F. field region so that the coupled impedances of the choke coils are minimized thereby eliminating the effect of the spurious resonances from the choke coils on the oscillator.

During the operation of the oscillator 10 at the lower end of the frequency band, there is a combined interelectrode capacitance of both the transistor case and the transistor 40 referred to as $C'_{cb}$, $C'_{be}$ and $C'_{ce}$. During the operation of the oscillator 10 at the higher end of the frequency band, there is present lead inductances $L_b$ and $L_e$, interelectrode capacitance of the transistor 40 designated $C_{cb}$, $C_{be}$ and $C_{ce}$; and interelectrode capacitance from the transistor case designated $C_1$, $C_2$ and $C_3$.

The capacitance of the variable-capacitance diodes 25 and 26 is controlled by the voltage applied to the terminal 31, which in the preferred embodiment ranges from $-.6$ to $+60$ volts. To produce oscillations in the oscillator 10, the collector-emitter potential of the transistor 40 must equal to or be in excess of the base-emitter potential of the transistor 40, the collector-emitter potential of the transistor 40 must be substantially 180° out of phase with the base-emitter potential, and the base-collector impedance forms a resonant circuit at the generating frequency with the base-emitter impedance and the collector-emitter impedance.

During the operation of the oscillator 10 at the lower end of the frequency band, the tuning line segments **20*a* and 20*b* and the variable-capacitance diodes 25 and 26 are in series. The tuning line segments 20*a* and 20*b* and the diodes 25 and 26 are in parallel with the combined interelectrode capacitance of the base and collector of the transistor 40 and the transistor case capacitances. The just-mentioned parallel circuit is in parallel with the series combination of interelectrode capacitance of the base and emitter, and collector and emitter of the transistor 40. The line segments 20*a* and 20*b*, the diodes 25 and 26 and the interelectrode capacitances of the transistor 40 and the transistor case form the tuned output circuit for the oscillator 10 to determine the resonant frequency and the generating frequency of the oscillator 10. In selecting the generating frequency of the oscillator 10, the capacitance of the diodes 25 and 26 varies inversely with the magnitude of the reverse bias voltage applied thereto. The tuning line segments 20*a* and 20*b* and the diodes 25 and 26 at the lower end of the frequency band for the oscillator 10 take on the characteristics of an inductive network. The application of a forward bias on the diodes 25 and 26 produces a low resistance and the inductive tuning line segments 20*a* and 20*b* resonate with the interelectrode capacitance of the transistor 40** and the transistor case.

During the operation of the oscillator 10 at the upper end of the frequency band, the tuning line segments **20*a* and 20*b* are in series with the variable-capacitance diodes 25 and 26, which are in parallel with the combined interelectrode capacitance of the base and collector of the transistor 40. The just-mentioned parallel circuit is in series with the lead inductance $L_b$ of the base electrode 41 of the transistor 40. The last-mentioned parallel-series circuit, in turn, is in parallel with the series combination of interelectrode capacitance of the base and emitter, and collector and emitter of the transistor 40. The line segments 20*a* and 20*b*, the diodes 25 and 26 and the interelectrode capacitances of the transistor 40 and the transistor case form the tuned output circuit for the oscillator 10 to determine the resonant frequency and the generating frequency of the oscillator 10. The tuned output circuit for the oscillator 10 at the upper end of the frequency band for the oscillator 10 takes on the characteristics of a reduced inductive network. A reverse bias application to the variable-capacitance diodes 25 and 26 reduces the capacitance of the diodes 25 and 26 in series with the inductance of the tuning line segments 20*a* and 20*b*** and the base lead inductance $L_b$ to give a net lower inductance for the network. Resonance with the transistor capacitances must, therefore, occur at a higher frequency.

A wide frequency range for the oscillator 10 is achieved by the application of a forward and reverse bias to the diodes 25 and 26. The use of a capacitively coupled ground collector electrode with a series resonant circuit to the base electrode 41 of the transistor 40 extends the frequency range by making the base lead inductance a part of the tuned output circuit of the oscillator 10. The emitter inductance performs as an R.F. choke to further isolate the emitter R.F. voltages for the emitter power supply.

It is to be understood that modifications and variations of the embodiment of the invention disclosed herein may be resorted to without departing from the spirit of the invention and the scope of the appended claims.

Having thus described our invention, what we claim as new and desire to protect by Letters Patent is:

1. A voltage tuned oscillator comprising a symmetrical transmission line structure, a tuning line disposed along an axis of transmission line symmetry of said structure, variable impedance means disposed in said tuning line intermediate the ends thereof for forming a resonant circuit therewith, variable voltage means connected to said variable impedance means for controlling the impedance thereof to select a resonant frequency for said resonant circuit, an output device coupled to said tuning line for removing a generated signal, a source of potential, and a transistor with a base electrode, collector electrode and an emitter electrode, said base electrode being connected to said tuning line for employing said tuning line and said variable impedance means as a resonant impedance for generating a signal, said emitter electrode and said collector electrode being connected to said source of potential, said resonant circuit being resonant over a band of frequencies in response to said variable voltage means controlling the impedance of said variable impedance means in selecting a resonant frequency for said resonant circuit.

2. A voltage tuned oscillator as claimed in claim 1 wherein said base electrode is connected in series with said tuning line.

3. A voltage tuned oscillator as claimed in claim 1 wherein said collector electrode is capacitively coupled to ground.

4. A voltage tuned oscillator as claimed in claim 2 wherein said collector electrode is capacitively coupled to ground.

5. A voltage tuned oscillator as claimed in claim 1 wherein said variable impedance means comprises variable capacitance diodes symmetrically disposed in said tuning line, and wherein said variable voltage means at times applies a voltage to said diodes for forward biasing said diodes, said diodes thereby present a low resistance in said resonant circuit, whereby the resonant frequency of said resonant circuit is in a lower frequency region and said resonant circuit takes on the characteristics of an inductive network, said variable voltage means at other times applies a voltage to said diodes for reverse biasing said diodes, said diodes thereby function as variable capacitors with the capacitance thereof varying inversely with said applied voltage, whereby the resonant frequency of said resonant circuit is in a higher frequency region and said resonant circuit has the effective inductance thereof reduced.

6. A voltage tuned oscillator as claimed in claim 1 and comprising a damping resistor connected to said base electrode for reducing oscillations at spurious modes.

7. A voltage tuned oscillator as claimed in claim 1 and comprising a resistor disposed within said structure and connected to said emitter electrode for minimizing relaxation oscillations.

8. A voltage tuned oscillator as claimed in claim 1 wherein said transmission line structure has a low field region and said oscillator comprises a coil disposed in the low field region of said transmission line structure and connected to said tuning line for providing circuit coupling, whereby the coupled impedance of said coil is reduced.

9. A voltage tuned oscillator as claimed in claim 8 wherein said coil is an R.F. coil.

10. A voltage tuned oscillator as claimed in claim 9 wherein said transmission line structure has a rectangular configuration.

11. An oscillator comprising a symmetrical transmission line structure, a tuning line disposed along an axis of transmission line symmetry of said structure, variable impedance means disposed in said tuning line intermediate the ends thereof for forming a resonant circuit therewith, means connected to said variable impedance means for controlling the impedance thereof, an output device coupled to said tuning line for receiving a generated signal, a source of potential, circuit means coupled to said tuning line for employing said tuning line and said variable impedance means as a resonant impedance for generating a signal, said circuit means comprising a transistor having a base electrode, a collector electrode and an emitter electrode, said base electrode being connected in series with said tuning line, and said collector electrode and said emitter electrode being connected to said source of potential, and a damping resistor connected to said base electrode for reducing oscillations at spurious modes.

12. An oscillator comprising a symmetrical transmission line structure, a tuning line disposed along an axis of transmission line symmetry of said structure, variable impedance means disposed in said tuning line intermediate the ends thereof for forming a resonant circuit therewith, means connected to said variable impedance means for controlling the impedance thereof, an output device coupled to said tuning line for receiving a generated signal, a source of potential, circuit means coupled to said tuning line for employing said tuning line and said variable impedance means as a resonant impedance for generating a signal, said circuit means comprising a transistor having a base electrode, a collector electrode and an emitter electrode, said base electrode being connected in series with said tuning line, said collector electrode and said emitter electrode being connected to said source of potential, and a resistor disposed in said transmission line structure and connected to said emitter electrode for minimizing relaxation oscillations.

References Cited

UNITED STATES PATENTS

| | | | |
|---|---|---|---|
| 2,337,219 | 12/1943 | Zottu | 331—101 X |
| 2,817,761 | 12/1957 | Hollmann | 331—117 |
| 3,162,824 | 12/1964 | Herzog | 331—101 X |
| 3,271,698 | 9/1966 | Adams | 331—117 |
| 3,067,394 | 12/1962 | Zimmerman et al. | 307—88.5 |
| 3,108,239 | 10/1963 | Koueiter | 307—88.5 |

OTHER REFERENCES

R. H. Bradsell et al., "Transistor UHF Oscillator," Wireless World, August 1964, pp. 400, 401.

Crystalonics, Inc., Application Notes ANV–11, "Detuning and Temperature Compensation of the Varactron Diode," 2 pages, September 1965.

ROY LAKE, *Primary Examiner.*

S. H. GRIMM, *Assistant Examiner.*